United States Patent
Alcoe et al.

(10) Patent No.: US 6,631,078 B2
(45) Date of Patent: Oct. 7, 2003

(54) ELECTRONIC PACKAGE WITH THERMALLY CONDUCTIVE STANDOFF

(75) Inventors: David J. Alcoe, Vestal, NY (US); Varaprasad Venkata Calmidi, Vestal, NY (US); Krishna Darbha, Johnson City, NY (US); Sanjeev Balwant Sathe, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/044,204

(22) Filed: Jan. 10, 2002

(65) Prior Publication Data

US 2003/0129863 A1 Jul. 10, 2003

(51) Int. Cl.⁷ ................................................. H05K 7/20
(52) U.S. Cl. ......................... 361/719; 361/710; 257/719
(58) Field of Search ................................. 361/719, 704, 361/705, 706, 710; 257/713, 706, 707, 718, 719; 29/840; 439/73; 228/180.22

(56) References Cited

U.S. PATENT DOCUMENTS

| | | | |
|---|---|---|---|
| 5,045,921 A | 9/1991 | Lin et al. .......................... 357/74 |
| 5,170,931 A | 12/1992 | Desai et al. ..................... 228/180 |
| 5,541,450 A | 7/1996 | Jones et al. ..................... 257/697 |
| 5,661,902 A * | 9/1997 | Katchmar ....................... 361/719 |
| 5,714,803 A * | 2/1998 | Queyssac ........................ 257/738 |
| 5,781,412 A * | 7/1998 | de Sorgo ........................ 361/704 |
| 5,804,882 A | 9/1998 | Tsukagoshi et al. ........... 257/783 |
| 5,805,427 A | 9/1998 | Hoffman ......................... 361/770 |
| 5,889,652 A * | 3/1999 | Turturro .......................... 361/705 |
| 5,901,041 A * | 5/1999 | Davies et al. .................. 361/704 |
| 5,931,371 A | 8/1999 | Pao et al. ........................ 228/180 |
| 6,016,007 A * | 1/2000 | Sanger et al. .................. 257/714 |
| 6,268,239 B1 * | 7/2001 | Ikeda .............................. 257/717 |
| 6,411,513 B1 * | 6/2002 | Bedard ........................... 361/704 |

OTHER PUBLICATIONS

IBM Technical Disclosure Bulletin by V.D. Coombs, entitled "Chip Mounting With Prestretched Joints", vol. 16, No. 3, Aug. 1973, pp. 767.
IBM Technical Disclosure Bulletin by A.F. Galloway, et al., entitled "Stand–Offs For Chip Allignment As Well As Controlled Collapse In Chip Joining", vol. 23, No. 5, Oct. 1980, pp. 2156–2158.
IBM Technical Disclosure Bulletin by R.A. Foster, entitled "Area Array Substrate–To–Carrier Interconnection Using Corner Standoff", vol. 29, No. 11, Apr. 1987, pp. 4736–4737.

* cited by examiner

Primary Examiner—Neil Abrams
(74) Attorney, Agent, or Firm—John A. Jordan; Arthur J. Samodovitz

(57) ABSTRACT

A heat dissipating flexible or resilient standoff is mechanically clamped between an electronic module and substrate, such as, PCB. The clamping arrangement comprises a heat sink compressing a thermally conductive flexible interface pad over the upper surface of the electronic module by way of mechanical linkage to the PCB. The heat dissipating flexible standoff provides a force opposing the compression force to thereby reduce stress on solder ball connections between electronic module and PCB. Thermally conductive flexible standoffs in the form of spring arrangements, such as a wire mesh, act to provide heat dissipation by both thermal conduction and thermal convection. A thermally conductive flexible polymer pad and a layer of porous metal foam may also act as thermally conductive standoffs.

17 Claims, 3 Drawing Sheets

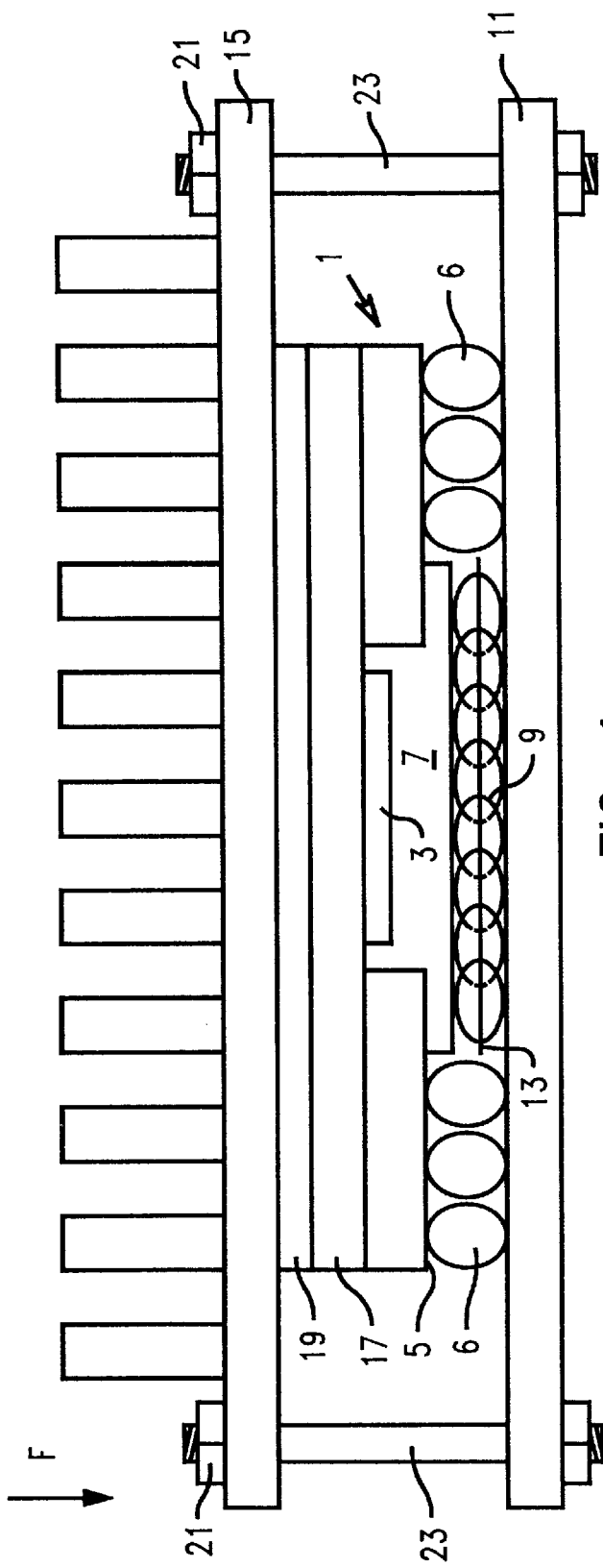
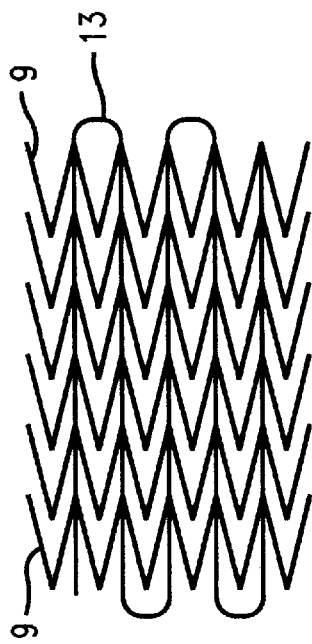
FIG. 1a
FIG. 1b

ELECTRONIC PACKAGE WITH THERMALLY CONDUCTIVE STANDOFF

BACKGROUND OF THE INVENTION

1. Field of the Invention

The present invention relates, in general, to an electronic semiconductor package and, more particularly, to an electronic semiconductor package having standoffs positioned within the central portion of the package base.

2. Background and Related Art

To reduce manufacturing costs, the electronic industry is continuously redesigning electronic packaging. To this end, the industry is increasingly employing ball grid array (BGA) packages where, for example, the perimeter of the package is used to make electrical connections. In perimeter packages, such as BGA packages, conductive solder balls may be arranged in a patterned array of peripheral pads on the laminate holding the semiconductor chip.

In addition to manufacturing cost reduction, the electronics industry is continuously endeavoring to reduce both the size of electronic packages and the pitch between conductive solder balls in order to accommodate the higher counts coming from higher density chips. With increased speed and smaller packages, increased heat may cause an increased failure rate of solder joints during temperature cycling due to the higher strain levels at the joints.

To reduce the levels of heat generated within electronic packages, and thus solder joint fatigue, various forms of heat dissipating means have been employed. One mechanism employed to facilitate heat dissipation is a heat sink positioned external to the package. One low cost method of attaching a heat sink to the electronic package is to mechanically clamp the heat sink to the package through a heat spreader and flexible thermal interface pad. However, to achieve good thermal conduction, these pads must be compressed with a sufficiently large pressure which tends to apply pressure to the solder balls. To further reduce the failure rate of solder joints, efforts have been made in the prior art to maintain height in the solder balls which would otherwise be lost due to solder ball collapse during reflow. The reason for controlling solder ball height is that the thinner the solder ball joint, once solidified, the more prone that joint is to fatigue fracture. One technique for controlling the height of solder ball joints during reflow is to use standoffs. Typical of such arrangements are those described in U.S. Pat. No. 5,541,450 to Jones, et al. and U.S. Pat. No. 5,805,427 to Hofmnan.

The difficulty with prior art standoff arrangements is that they are not designed to withstand any significant external pressure applied to the package and thereby limit the pressure acting on the component. Moreover, the prior art standoff arrangements typically are bonded to the PCB and electronic package which bonding may tend to cause warping due to thermal differences in the TCE of the materials which are bonded. In addition, such standoff arrangements fail to effectively provide any significant thermal dissipation paths to reduce the level of heat generated in the electronic package. The use of bonding to hold the electronic package to the PCB also makes assembly and rework difficult and costly.

SUMMARY OF THE PRESENT INVENTION

Accordingly, it is an object of the present invention to provide a method and apparatus for attaching an electronic module to a substrate therefor, such as, a PCB.

It is a further object of the present invention to provide a low cost arrangement for attaching an electronic module to a substrate therefor, such as, a PCB.

It is yet a further object of the present invention to provide structural arrangements for attaching an electronic package to a substrate, such as PCB, so as to provide effective thermal conduction paths therethrough.

It is still yet a further object of the present invention to provide a method and apparatus for improving heat dissipation from an electronic package.

It is another object of the present invention to provide a method and apparatus for attaching an electronic package to a PCB in a manner to reduce thermal warp between package and PCB and thermal fatigue on solder ball connections therebetween.

It is yet another object of the present invention to provide a method and apparatus for attaching an electronic package to a PCB so as to provide minimal force upon the solder ball connections therebetween.

It is still yet another object of the present invention to provide standoffs positioned between electronic module and PCB which standoffs are such as to provide both thermal dissipation paths from the module and sufficient resilience to absorb relatively high mechanical loads so as to result in minimal or no stress on solder connections therebetween.

In accordance with the present invention, there is provided an improved method and apparatus of attaching an electronic package or module to a substrate therefor, such as, a PCB. A resilient standoff structure is positioned between the electronic module and PCB with the resilient force of the standoff sufficient to withstand subsequent clamping forces used to hold the module to the board. Standoff structures are selected so as to provide, in addition to resilience, thermal conduction and convection paths away from electronic module. A heat sink structure is used to clamp the electronic module and standoff to the PCB so as to provide a major path for heat dissipation through the heat sink and additional paths of heat dissipation through the standoff. The clamping force is offset by the resilient force of the standoff such as to provide zero or minimal forces on the solder ball connections between the electronic module and PCB. Standoff structural layers which are non-resilient and porous, such as rigid foam, may also used.

The standoff structures are such as to provide resistance to warping while acting to control the height of the solder balls upon reflow. The open or porous nature of the standoffs is such as to provide air pathways that permit thermal dissipation through air flow in addition to the thermal conduction through the standoff structure. By mechanically clamping (rather than bonding) the standoffs between the electronic module and PCB, warpage due to differences in the TCE of the module and PCB materials is reduced.

These foregoing and other objects, features and advantages of the invention will be apparent from the following more particular description of a preferred embodiment of the invention, as illustrated in the accompanying drawings, wherein like reference members represent like parts of the invention.

BRIEF DESCRIPTION OF THE DRAWING

FIG. 1a shows a cross-sectional view of an electronic module mounted on PCB using interlocking helical springs as the resilient standoff.

FIG. 1b shows a top view of the interlocking helical springs of FIG. 1a.

DETAILED DESCRIPTION

Figure 2:
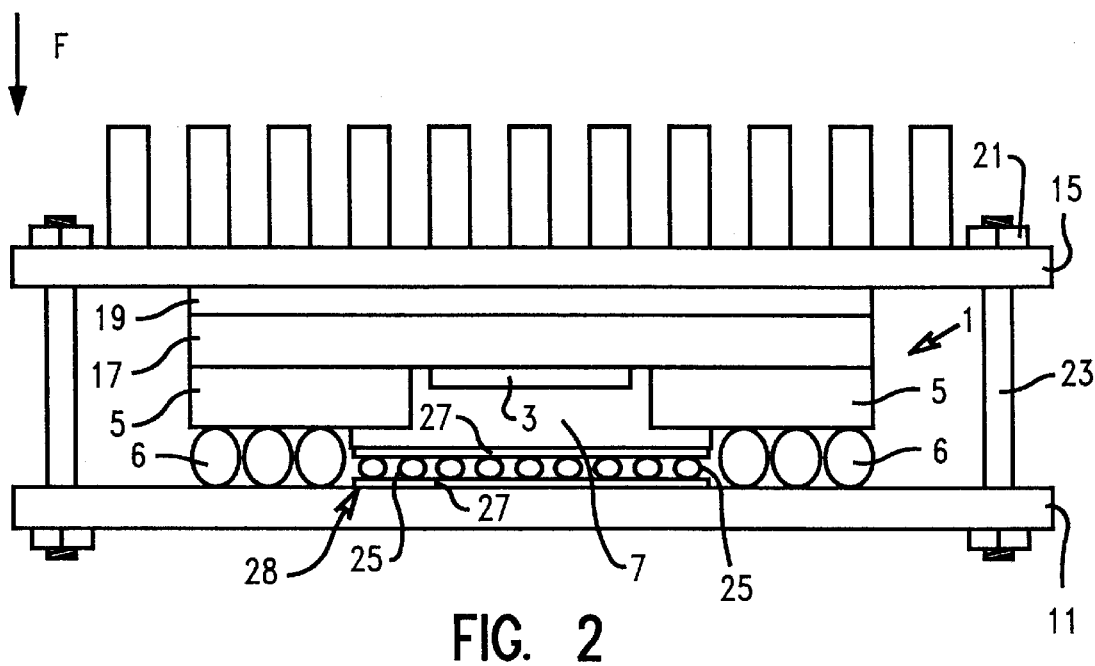
FIG. 2 shows a cross-sectional view of an electronic module mounted on PCB using hollow metal cylinders as the resilient standoff.

With reference to FIG. 1a, there is shown a cross-sectional view of an electronic package mounted upon a PCB using an interlocking helical spring arrangement as a resilient standoff, in accordance with one embodiment of the invention. Electronic package or module 1 is arranged as a peripheral BGA package wherein chip 3 is sealed in a cavity of laminate 5 by a suitable insulating bonding agent 7, such as an epoxy, as is known to those skilled in the art. It should be noted that bonding agent 7 extends outwardly from the cavity over a portion of the lower surface of laminate substrate 5. Laminate 5 may be any of a variety of materials. However, most typically, it is formed from an organic epoxy-glass resin based material. Although not shown, it should be understood that contact pads on the periphery of chip 3 are connected, through metallurgy extending through bonding agent 7, to BGA contact pads on the bottom surface of laminate 5. Connection of these BGA contact pads on laminate 5 is made to contact pads (not shown) on PCB 11 through conductive solder balls 6, as is known to those skilled in the art.

As is shown in FIG. 1a, interlocking helical springs 9 are positioned as a standoff between the surface of bonding agent 7 and PCB 11. Such springs are typically made of stainless steel and are tied together by a separate wire 13 which weaves through the springs holding them together to form a wire mesh. This is shown more clearly in the top view of FIG. 1b wherein wire 13 is shown weaving through separate springs 9. Alternatively, interlocking helical springs 9 may take the form of commercially available wire mesh or wire cloth, such as that made by Anji Metal Wire Mesh Co. Ltd.

Helical springs 9 act to provide flexibility in the direction perpendicular to the plane of the axis of the helicals or mesh. The resilience of the springs is sufficient such that downward force upon electronic module 1 results in an equal and opposite resilient upward force from the springs. The purpose of this resilience will be clearer when it is understood that in the fabrication of low cost heat sink attachments, a thermally conductive flexible pad may be used between the heatsink and electronic module. For optimum performance, these thermal pads must be compressed with a sufficiently large pressure, typically of the order of 10 psi. Such is shown in FIG. 1a wherein heat spreader 17 and thermally conductive flexible interface pad 19 are shown positioned between heatsink 15 and electronic module 1. Compression of the thermally conductive flexible interface pad 19 is achieved by tightening nuts 21 on screws 23. Helical springs 9 provide an upward force opposing compression.

Assembly of electronic module 1 to PCB 11 may be achieved in the following manner. The BGA pads on electronic module 1 are aligned with solder balls 6 on the contact pads on PCB 11 with a mesh of interlocking springs 9 positioned therebetween as shown. In this regard, it should be understood that the drawings showing the different dimensions of the various pieces of the assembly are not to scale but are merely depicted to facilitate a description of the subject matter. The area size of the mesh is coextensive with the exposed surface area of bonding agent 7, as shown in FIG. 1a. Where no force is applied to electronic module 1, the resistance and height (the relaxed height) of helical springs 9 is such as to prevent solder balls 6 from making contact with the BGA pads on electronic module 1. Upon the application of an external downward force F upon electronic module 1, the BGA pads of the module are made to contact solder balls 6. This is the point where the downward force F is in equilibrium with the upward resistance force of the helical springs 9. Conventional reflow of the solder balls provides electrical connection of the module to the PCB with the height of the solder balls after reflow and cooling being controlled by the balancing of the downward force F and resistance force of the helical springs 9. After removal of force F, solder balls 6 are in tension by a force F.

Assembly of heat sink 15 to electronic module 1 may now be carried out so as to achieve zero or minimal tension on solder balls 6. This is done by tightening the heat sink with interposing thermally conductive flexible interface pad 19, heat spreader 17 and module 1 onto PCB 11, as shown in FIG. 1a. To achieve zero minimal force on solder balls 6, the tightening is carried out to a force F. Typically, F equals around 10 psi.

It should be noted that not only do helical springs 9 provide a resilient standoff to maintain solder balls 6 in a condition of zero or minimum force thereon, they also facilitate thermal dissipation from the electronic module 1 by providing a thermal conduction path away from the module through the helical springs and a thermal convection path by air flow through openings in the springs. This is to be contrasted with prior art techniques which typically bond a solid layer standoff to the electronic module and PCB. Such standoffs do not facilitate thermal dissipation and may tend to cause warping because of differences in TCE of the bonded materials. In accordance with the present invention, the various standoffs may not be bonded to either the electronic module or PCB. Moreover, because the standoffs in accordance with the present invention cover a relatively large area, they act to reduce localized pressure and further mechanically inhibit warping.

FIG. 2 shows a cross-sectional view of an electronic module mounted on PCB using hollow metal cylinders 25 as the resilient standoff means. Typically, cylinders 25 may be made of stainless steel and may be either circular or elliptical in shape. The cylinders are positioned between and bonded to a pair of metal plates 27 to form the complete standoff 28. Typically, the plates may be 5 mil stainless steel plates. Other than a different standoff structure, the features and function of the arrangement of FIG. 2 are the same as FIG. 1a with the same reference characters being used to identify the same parts.

As was similarly described with respect to FIG. 1a, the hollow cylinder standoff 28 provides the resilient force that interlocking helical springs 9 provided. The cylinders 25 and plates 27 of this standoff also provide heat transfer from electronic module 1 by thermal conduction through the cylinders and plates, and thermal convection via air in and around the cylinders. The stiffness and areal size of the plates with cylinders therebetween also acts to inhibit warpage and localization of pressure. As was described with respect to the standoff of FIG. 1a, plates 27 of standoff 28 are not bonded or otherwise attached to either electronic module 1 or PCB 11 but are rather held in place by the clamping action caused by heat sink 15 compressing electronic module 1 against PCB 11, by way of screws 23. It is clear, however, that prior to positioning electronic module 1 on standoff 28, the standoff could be bonded to PCB 11. As was similarly described with respect to FIG. 1a, for the best heat dissipation, the areal size of plates 27 is coextensive with the exposed surface area of insulating bonding agent 7, as shown in FIG. 2.

Assembly may be carried out in the same manner as that described in regard to FIG. 1a with hollow cylinders 25 of the standoff having sufficient resilience and height to hold electronic module 1 from making contact with solder balls 6 until a sufficient downward force F is applied to the module to bring the module pads into contact with the solder balls to carry out solder reflow. After reflow and cooling, the downward force F applied during reflow is replaced by the same force F by clamping heat sink 15 and module 1 to PCB 11, as was described with respect to FIG. 1a.

Figure 3:
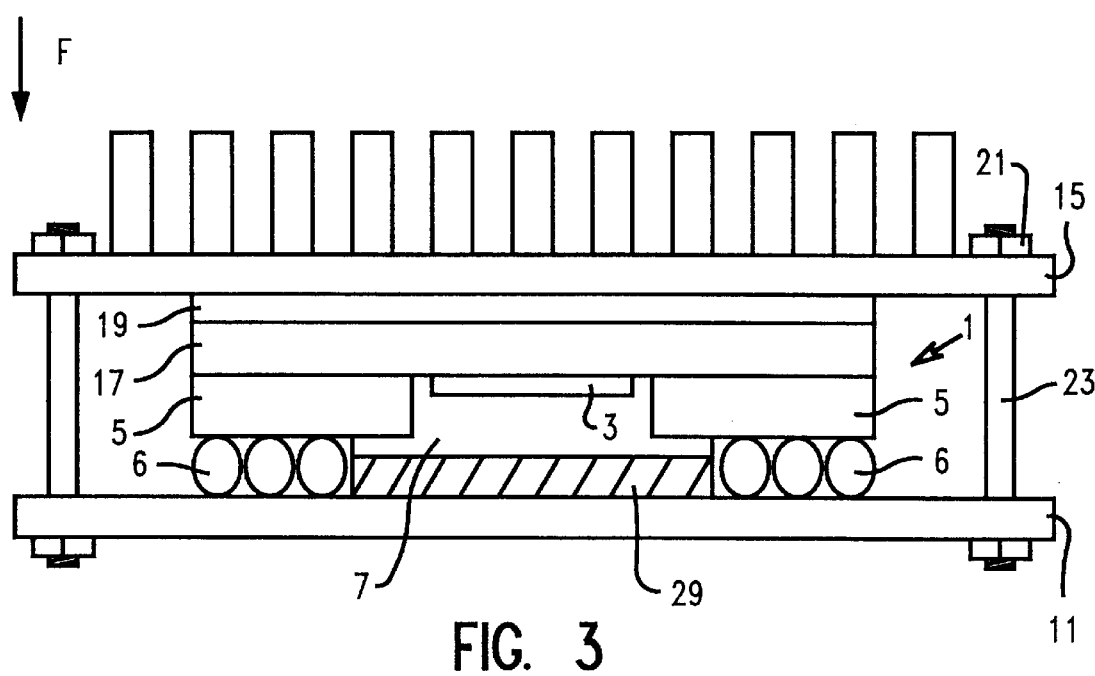
FIG. 3 shows a cross-sectional view of an electronic module mounted on PCB using a thermally conductive flexible polymer pad as the resilient standoff.

FIG. 3 shows a cross-sectional view of an electronic module mounted on PCB using a flexible polymer pad 29 as the resilient standoff. Typically, such pads are elastomers, alumina filled silicones with fiberglass reinforcement. Such materials are both resilient and thermally conductive and provide characteristics akin to the characteristics described for the standoffs of FIGS. 1a and 2. An example of such material is CHO-THERM sold by Chomerics, Inc. However, heat dissipation using such an arrangement is primarily through thermal conduction.

As was described with respect to FIGS. 1a and 2, the thickness or height and resilience of flexible pad standoff 29 is such as to hold electronic module 1 from making contact with solder balls 6 until a sufficient downward force F is applied to the module whereby solder reflow may be carried out. Again, assembly is carried out in the same manner as was described with respect to FIGS. 1a and 2 with the various structural features and functions of the arrangement of FIG. 3, other than standoff material, being the same as FIGS. 1a and 2 with the same reference characters being used to identify the same parts.

Figure 4:
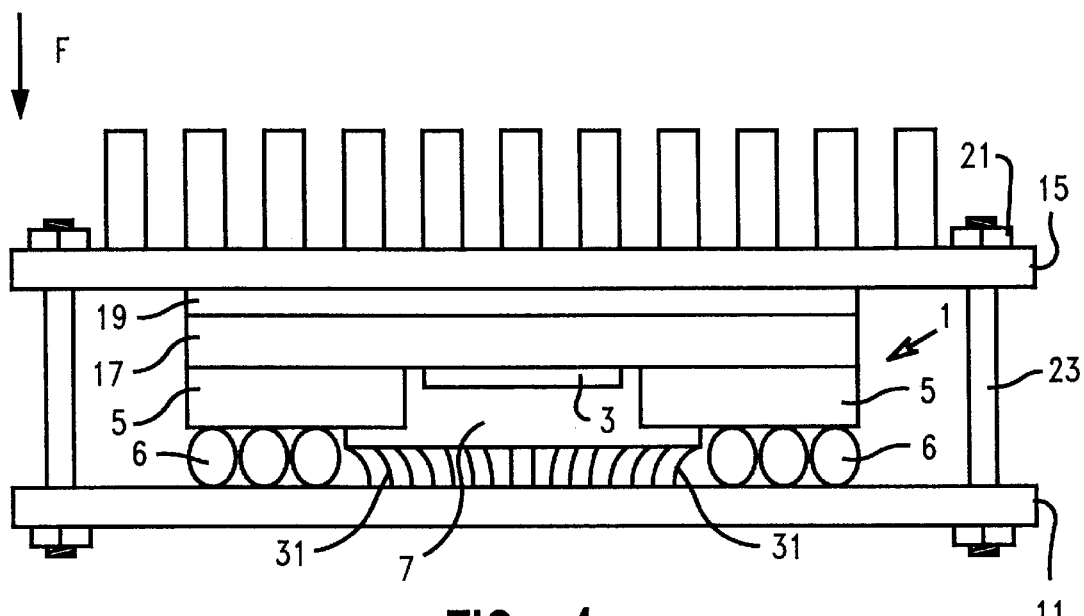
FIG. 4 shows a cross-sectional view of an electronic module mounted on PCB using flexible steel wires as the resilient standoff.

FIG. 4 shows a cross-sectional view of an electronic module mounted on PCB using relatively rigid metal filaments or "whiskers" 31 as a resilient standoff. The filaments may be made of, for example, stainless steel. However they may also be made of any material that is normally stiff but will bend without breaking upon application of downward force thereby providing the resilience akin to that described in FIGS. 1a–3. As shown in FIG. 4, the length of the filaments become increasingly longer with increasing bends as they are positioned out from the central portion of the surface of bonding agent 7. Such a pattern acts to provide more resilience or upward reaction pressure at the central portion with diminishing resilience moving outwardly from the central portion. It is clear that this allows control of the distribution of the reaction pressure on the component; more pressure exists where the filaments are shorter and less prone to buckle and bend. Alternative patterns are also possible. For example, an upward reaction pressure distribution pattern may be predetermined to control the amount and placement of pressure in accordance with the critical or delicate regions of the component, to thereby avoid deformation, damage and associated reliability problems. Other means, such as pre-bending of filaments to various degrees, using filaments of various material stiffnesses and fiber thickness, and filament patterns of various distribution densities can also obviously be employed.

The filaments 31 may be uniformly positioned and bonded to PCB 11 by any of a variety of bonding agents. With filaments 31 bonded to PCB 11, assembly may be carried out in a manner akin to that described in FIGS. 1a–3. In this regard, filaments 31, when bonded to PCB 11, are designed to have a uniform height for contact to the surface of bonding agent 7 of the module. In addition, the height and resilience of filaments 31 are sufficient to prevent electronic module 1 from making contact with solder balls 6 until a sufficient downward force F is applied to the module to carry out solder reflow, as described in the previous embodiments. After reflow and cooling, the downward force F applied during reflow is replaced with the same force F by clamping heat sink 15 to PCB 11, as was described in FIGS. 1a–3.

Filaments 31 not only provide a resilient standoff to maintain a condition of zero or minimum force on the solder ball connections, they also facilitate thermal dissipation, like the standoffs in FIGS. 1a–3, by providing a thermal conductive path away from the module through the filaments and a thermal convection path by air flow between the filaments.

Figure 5:
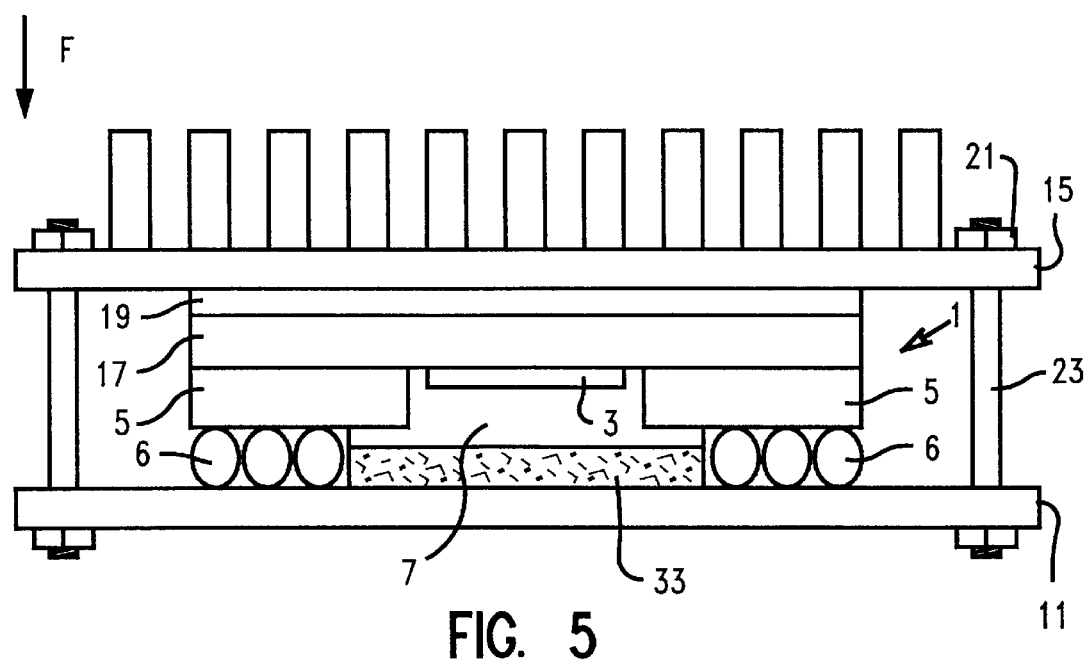
FIG. 5 shows a cross-sectional view of an electronic module mounted on PCB using a porous metal foam as a rigid standoff.

FIG. 5 shows a cross-sectional view of an electronic module mounted on PCB using a layer of porous metal foam 33 as a standoff. Such material is typically aluminum, and has an "open-celled" structure similar to that of STYROFOAM, but is relatively rigid. Such foams are available in a variety of forms from a variety of manufacturers. For example, M-Pore, Inc. of Dresden, Germany produces open celled metal foams in a wide variety of alloys, such as Sn, Al, Cu, Au, Ag and Fe.

Unlike the arrangements in FIGS. 1a–4, the metal foam standoff 33 of FIG. 5 has a height or thickness sufficient to allow electronic module 1 to make contact at its pads to solder balls 6 positioned on the pads of PCB 11. As in FIGS. 1a–4, such height allows vertical control of the solder balls upon reflow and cooling. After reflow of the solder balls to make electrical connection, heat sink 15 is attached to clamp module 1 to PCB 11, in the manner described above with regard to FIGS. 1a–4. Since metal foam standoff 33 is sufficiently rigid and strong, the application of force F to clamp heat sink 15 and module 1 to PCB 11 results in little or virtually no force on solder balls 6.

Metal foam standoff 33 not only acts as a standoff, it, like the standoffs of FIGS 1a–4, also facilitates thermal dissipation from electronic module 1 by providing a thermal conduction path away from the module through the metal and a thermal convection path through the air passages in the pores in the metal.

Each of the standoff arrangements, in accordance with present the invention, not only acts to reduce the forces applied to solder ball connections between electronic module and the substrate therefor, such as PCB, they also act to provide additional heat dissipating paths from the module. The standoffs, in accordance with the present invention, additionally act to optimize solder ball shape and reduce localized pressures, while at the same time acting to withstand the relatively high pressures used in low cost heat sink assemblies. Since the standoffs, in accordance with the present invention, are externally mechanically clamped in position, rather than being bonded in position, and cover a relatively large surface area, they further act to reduce warpage in the assembly. Moreover, the clamping feature facilitates relative ease in disassembly for rework and the like, if necessary.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of attaching an electronic module to a substrate therefor, comprising:

positioning a heat dissipating and force resisting standoff layer between said electronic module and said substrate such that peripheral solder balls on said substrate are aligned with contact pads on said electronic module, said heat dissipating standoff layer comprising thermally conductive material having openings therethrough so as to provide air pathways that permit thermal dissipation by both air flow and thermal conduction;

heating said solder balls to a temperature to cause solder reflow to thereby make solder connections to said contact pads on said electronic module with said heat dissipating standoff layer acting to maintain the height of said solder balls during solder reflow; and applying a sufficient compression force to said electronic module and said substrate to mechanically clamp said heat dissipating standoff layer therebetween with said heat dissipating standoff layer providing sufficient resisting force so as to cause substantially zero pressure to be applied to said solder connections.

2. The method as set forth in claim 1 wherein said compression force is applied by a heat sink positioned over said electronic module with a thermally conductive flexible interface positioned therebetween.

3. The method as set forth in claim 2 wherein said heat dissipating standoff layer is flexible with a height greater than the height of said solder balls.

4. The method as set forth in claim 3 wherein said step of heating said solder balls to make solder connections to said contact pads on said electronic module, comprises:

applying a preliminary force to said module to compress said heat dissipating flexible standoff layer sufficiently to cause the said contact pads on said electronic module to make contact with said solder balls on said substrate;

applying heat to said solder balls to cause solder reflow;

removing said preliminary force applied to said electronic module;

positioning a heat sink on said electronic module on the side opposite to the side of the position of said heat dissipating standoff layer; and applying a compression force to said heat sink to clamp said electronic module to said substrate with said compression force being approximately equal to said preliminary force.

5. The method as set forth in claim 3 wherein said heat dissipating flexible standoff layer comprises a thermally conductive flexible wire mesh.

6. The method as set forth in claim 3 wherein said heat dissipating flexible standoff layer comprises an array of thermally conductive flexible cylinders between a pair of thermally conductive rigid plates.

7. The method as set forth in claim 3 wherein said heat dissipating flexible standoff layer is positioned between said electronic module and said substrate such that peripheral solder balls on said electronic module are aligned with contact pads on said substrate.

8. The method as set forth in claim 3 wherein said heat dissipating flexible standoff layer comprises an array of compressible filaments extending between said electronic module and substrate.

9. The method as set forth in claim 2 wherein said heat dissipating standoff layer is a layer of porous metal.

10. The method as set forth in claim 4 wherein said peripheral contact pads on said electronic module are positioned on a laminate around a central cavity having a semiconductor device bonded therein and wherein said substrate is a PCB.

11. A method of attaching an electronic module to a substrate therefor, comprising:

positioning a thermally conductive and resilient standoff layer onto a substrate hosting a peripheral array of solder balls on contact pads such that said thermally conductive standoff layer is located central to said peripheral array of solder balls, said thermally conductive standoff layer having a relaxed height greater than the height of said solder balls;

positioning an electronic module on said thermally conductive standoff layer with said electronic module having a peripheral array of contact pads around a central cavity having a semiconductor device bonded therein, said electronic module being positioned so that said peripheral array of contact pads align with said peripheral array of solder balls;

applying a temporary force to said electronic module to cause said peripheral array of contact pads on said electronic module to come into contact with said peripheral array of solder balls;

heating said solder balls to a temperature sufficient to cause reflow and make electrical connections between said peripheral array of solder balls and said peripheral array of contact pads;

removing said temporary force from said electronic module so as to put said electrical connections under tension;

positioning a heat sink on said electronic module on the side of said module opposite to the side of said thermally conductive standoff layer; and applying a compression force to said heat sink to clamp said electronic module and said thermally conductive standoff layer to said substrate to relieve said tension.

12. An electronic module and substrate assembly, comprising:

an electronic module having an array of peripheral contact pads on one surface around a central portion encapsulating a semiconductor device with bonding material;

a substrate for said electronic module, said substrate having an array of contact pads formed in a pattern that matches the location of said peripheral contact pads on said electronic module and are electrically connected thereto;

a thermally conductive and resilient standoff positioned between and unbonded to said electronic module and said substrate, said thermally conductive standoff having openings therethrough so as to provide air pathways that permit thermal dissipation by both convection and thermal conduction; and mechanical compression apparatus for applying a compression force to said electronic module and said substrate to mechanically clamp said thermally conductive standoff therebetween with said thermally conductive and resilient standoff providing sufficient resilient force so as to offset said compression force to the connections between said electronic module and substrate.

13. The assembly as set forth in claim 12 wherein said mechanical compression apparatus includes a heat sink in contact with a surface opposing said one surface of said electronic module.

14. The assembly as set forth in claim 13 wherein said heat sink is in contact with said surface opposing said one surface through a thermally conductive flexible interface.

15. The assembly as set forth in claim 14 wherein said thermally conductive standoff is a resilient metallic spring arrangement.

16. The assembly as set forth in claim 14 wherein said thermally conductive standoff comprises an array of metal cylinders positioned between and attached to a pair of metal plates.

17. The assembly as set forth in claim 14 wherein said thermally conductive standoff comprises a layer of porous metal foam.

* * * * *